(12) United States Patent
Oshida et al.

(10) Patent No.: US 10,840,874 B2
(45) Date of Patent: Nov. 17, 2020

(54) MATCHING DEVICE

(71) Applicant: HITACHI KOKUSAI ELECTRIC INC., Tokyo (JP)

(72) Inventors: Yoshiyuki Oshida, Tokyo (JP); Naoya Fujimoto, Tokyo (JP); Norikazu Kato, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 39 days.

(21) Appl. No.: 16/083,281

(22) PCT Filed: Feb. 10, 2017

(86) PCT No.: PCT/JP2017/004947
§ 371 (c)(1),
(2) Date: Sep. 7, 2018

(87) PCT Pub. No.: WO2017/159151
PCT Pub. Date: Sep. 21, 2017

(65) Prior Publication Data
US 2019/0036507 A1    Jan. 31, 2019

(30) Foreign Application Priority Data

Mar. 18, 2016  (JP) .................................. 2016-055355

(51) Int. Cl.
*H03H 7/40* (2006.01)
*H05H 1/46* (2006.01)
(Continued)

(52) U.S. Cl.
CPC ......... *H03H 7/40* (2013.01); *H01J 37/32183* (2013.01); *H01P 5/04* (2013.01);
(Continued)

(58) Field of Classification Search
CPC .. H03H 7/40; H03H 7/383; H03H 7/52; H01J 37/32183; H01P 5/04; H01P 5/18
See application file for complete search history.

(56) References Cited

U.S. PATENT DOCUMENTS

2014/0354173 A1   12/2014  Matsuno
2015/0000841 A1    1/2015  Yamada et al.
(Continued)

FOREIGN PATENT DOCUMENTS

JP    2004-85446 A    3/2004
JP    2007-115838 A   5/2007
(Continued)

OTHER PUBLICATIONS

International Search Report dated Mar. 21, 2017.
(Continued)

*Primary Examiner* — Samuel S Outten
(74) *Attorney, Agent, or Firm* — Bacon & Thomas, PLLC

(57) ABSTRACT

A matching device includes a directional coupler, a matching circuit including a first variable capacitance capacitor and a second variable capacitance capacitor, and a control unit. The control unit calculates a reflection coefficient on the basis of a forward power and a reflected power that are detected by the directional coupler, changes the capacitance value of the first variable capacitance capacitor and the capacitance value of the second variable capacitance capacitor such that the calculated reflection coefficient becomes smaller, and makes the cycle of calculation of the set values of the capacitance value of the first variable capacitance capacitor and the capacitance value of the second variable capacitance capacitor shorter than the cycle of acquisition of the capacitance value of the first variable capacitance capacitor and the capacitance value of the second variable capacitance capacitor.

2 Claims, 13 Drawing Sheets

(51) Int. Cl.
*H01P 5/04* (2006.01)
*H03H 7/38* (2006.01)
*H03H 7/52* (2006.01)
*H01J 37/32* (2006.01)
*H01P 5/18* (2006.01)

(52) U.S. Cl.
CPC .............. *H01P 5/18* (2013.01); *H03H 7/383* (2013.01); *H03H 7/52* (2013.01); *H05H 1/46* (2013.01); *H05H 2001/4682* (2013.01)

(56) References Cited

U.S. PATENT DOCUMENTS

2015/0027637 A1   1/2015   Haga
2015/0236728 A1*  8/2015   Suzuki ................ H04B 5/0081
                                                          455/127.1
2016/0352302 A1   12/2016  Nakamura et al.
2017/0372873 A1   12/2017  Yamada et al.

FOREIGN PATENT DOCUMENTS

| JP | 2013-125892 A | 6/2013 |
| JP | 2014-236435 A | 12/2014 |
| JP | 2015-026475 A | 2/2015 |
| KR | 10-2014-0105467 A | 9/2014 |
| WO | 2015-129678 A1 | 9/2015 |

OTHER PUBLICATIONS

Japanese Office Action dated Oct. 16, 2019 issued in corresponding Japanese Patent Application No. 2018-505346 and English translation thereof.

* cited by examiner

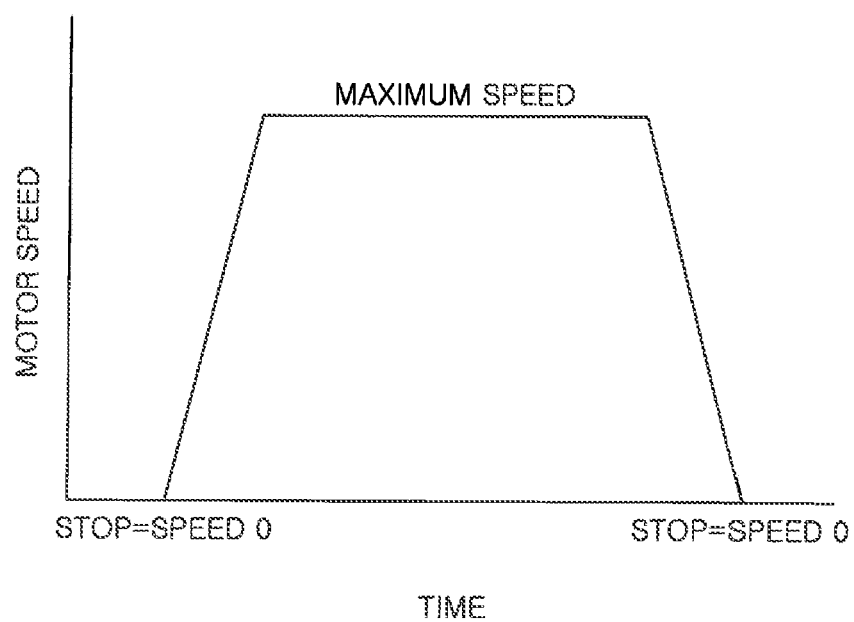

MATCHING DEVICE

FIELD OF THE INVENTION

The present invention relates to a matching device and can be applied to, e.g., a matching device for matching an output of an RF generator and a load.

BACKGROUND OF THE INVENTION

A plasma processing apparatus is used in a semiconductor manufacturing process for performing etching or thin film formation. As for a power supply source of the plasma processing apparatus, an RF generator is used. In order to efficiently supply power from the RF generator to the plasma processing apparatus, it is required to match impedance between the RF generator and the plasma processing apparatus (load). Generally, a matching device is interposed, as a unit for matching an impedance, between the RF generator and the plasma processing apparatus as described in, e.g., Patent Document 1. The matching device includes a matching circuit having a matching element for matching an impedance between the RF generator and the plasma processing apparatus. The matching circuit includes a variable capacitance capacitor, an inductance, and a transmission line.

Patent Document 1: PCT Publication No. WO2015/129678

The capacitance value of the variable capacitance capacitor is controlled by using a stepping motor, and a serial interface is used as an interface for a control terminal. When response time of the serial interface (from transmission/reception of a command to start of transmission/reception of a next command) is long, a calculation error is likely to occur due to a temporal error. It is an object of the present invention to provide a matching device that reduces a calculation error even when a long period of time is required to transmit/receive a command to/from a variable capacitance capacitor.

SUMMARY OF THE INVENTION

In accordance with an aspect of the present disclosure, there is provided a matching device including a directional coupler configured to detect a forward power and a reflected power; a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to the one end of the first variable capacitance capacitor and the other end connected to the one end of the second variable capacitance capacitor; and a control unit configured to control a capacitance value of the first variable capacitance capacitor and a capacitance value of the second variable capacitance capacitor based on the forward power and the reflected power detected by the directional coupler. The control unit calculates a reflection coefficient based on the forward power and the reflected power detected by the directional coupler, changes the capacitance value of the first variable capacitance capacitor and the capacitance value of the second variable capacitance capacitor such that the calculated reflection coefficient becomes smaller, and makes a cycle of calculation of set values of the capacitance value of the first variable capacitance capacitor and the capacitance value of the second variable capacitance capacitor shorter than a cycle of acquisition of the capacitance value of the first variable capacitance capacitor and the capacitance value of the second variable capacitance capacitor.

Effect of the Invention

With the above configuration, a calculation error can be reduced.

BRIEF DESCRIPTION OF THE DRAWINGS

FIG. 9 is a flowchart of a matching operation according to an embodiment.

DETAILED DESCRIPTION OF THE EMBODIMENTS

Figure 1:
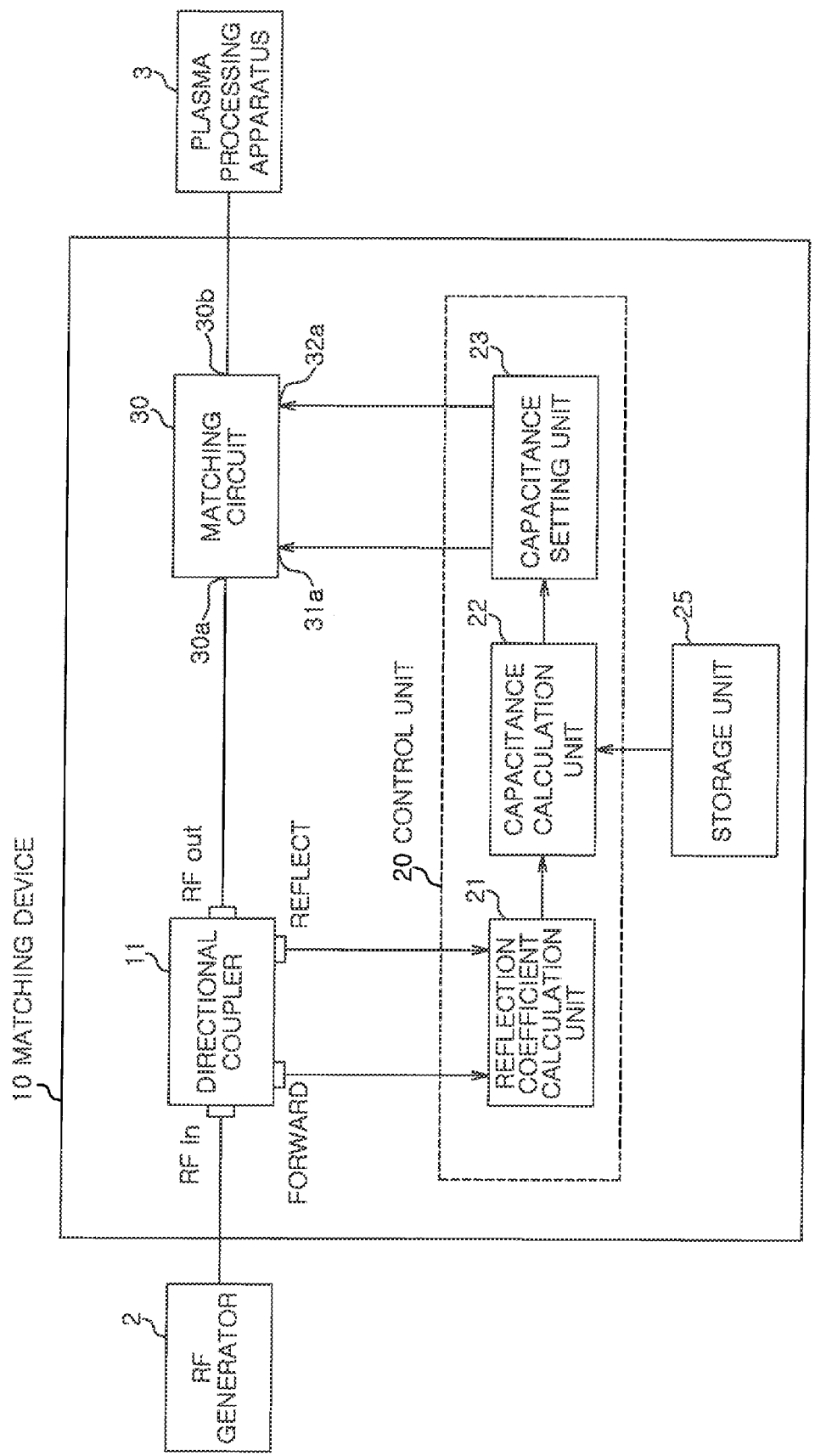
FIG. 1 is a functional block diagram of a matching device according to an embodiment.

Hereinafter, an embodiment and a comparative example will be described with reference to the drawings. In the following description, like reference numerals will be given to like parts, and redundant description thereof will be omitted.

FIG. 1 is a functional block diagram of a matching device according to an embodiment. Referring to FIG. 1, a matching device 10 is interposed between an RF generator and a plasma processing apparatus 3. The RF power outputted from the RF generator 2 is supplied to the plasma processing apparatus 3 via the matching device 10. Accordingly, plasma is generated in the plasma processing apparatus 3. In order to efficiently supply the power from the RF generator 2 to the plasma processing apparatus 3, it is required to match an impedance between the RF generator 2 and the plasma processing apparatus 3. An output impedance of the RF generator 2 is generally 50Ω. Therefore, it is preferable to set an input impedance of the matching device 10 to 50Ω by converting an input impedance of the plasma processing apparatus 3 using the matching device 10.

The input impedance of the plasma processing apparatus 3 varies depending on types, flow rates, pressure and temperatures of gases to be supplied to the plasma processing apparatus 3. Therefore, the matching device 10 needs to perform adaptive matching in response to the temporally varying input impedance of the plasma processing apparatus 3.

The matching device 10 shown in FIG. 1 includes a directional coupler 11 for detecting a forward power and a reflected power, a matching circuit 30 having a matching element for matching an impedance between the RF generator 2 and the plasma processing apparatus 3, a control unit 20 for controlling a circuit constant of the matching element of the matching circuit 30, and a storage unit 25.

Hereinafter, the operation of the directional coupler 11 will be described. An RF power (forward power: Pf) traveling from an $RF_{in}$ terminal toward an $RF_{out}$ terminal is detected by the directional coupler 11 and outputted to a FORWARD terminal. An RF power (reflected power: Pr) traveling from the $RF_{out}$ terminal to the $RF_{in}$ terminal is detected by the directional coupler 11 and outputted to a REFLECT terminal. The RF power Pf traveling from the $RF_{in}$ terminal to the $RF_{out}$ terminal is not detected by the REFLECT terminal, or even if detected, the amount thereof is very small. Similarly, the RF power Pr traveling from the $RF_{out}$ terminal to the $RF_{in}$ terminal is not detected by the FORWARD terminal, or even if detected, the amount thereof is very small.

The control unit 20 includes a reflection coefficient calculation unit 21, a capacitance calculation unit 22, and a capacitance setting unit 23.

The forward power Pf and the reflected power Pr detected by the directional coupler 11 are inputted to the reflection coefficient calculation unit 21 of the control unit 20. The reflection coefficient Γ is defined from an amplitude ratio r of the reflected power Pr to the forward power Pf and a phase difference 9 therebetween, as in the following Eq. (1).

$$\Gamma = r \cdot \exp(j \cdot \theta) \quad (j \text{:imaginary unit}) \qquad \text{Eq. (1)}$$

Therefore, the reflection coefficient Γ can be obtained if the amplitude ratio r of the reflected power Pr to the forward power Pf and the phase difference θ therebetween can be obtained. The reflection coefficient calculation unit 21 calculates the reflection coefficient Γ by obtaining the amplitude ratio r and the phase difference θ based on the travelling wave Pf and the reflected power Pr. Specifically, the forward power Pf and the reflected power Pr are transformed to a frequency domain by FFT (Fast Fourier Transform), and the amplitude ratio r and the phase difference θ are calculated by comparing the amplitudes and the phases of the travelling wave Pf and the reflected power Pr at a frequency equal to that of the RF power outputted from the RF generator 2.

The capacitance calculation unit 122 calculates a capacitance of a capacitor which makes the reflection coefficient Γ close to zero based on the reflection coefficient Γ calculated by the reflection coefficient calculation unit 21. The calculation of the capacitance of the capacitor will be described later. The capacitance setting unit 23 sets and changes a capacitance of a variable capacitance capacitor in the matching circuit 30 based on the capacitance of the capacitor which is calculated by the capacitance calculation unit 122.

Figure 2:
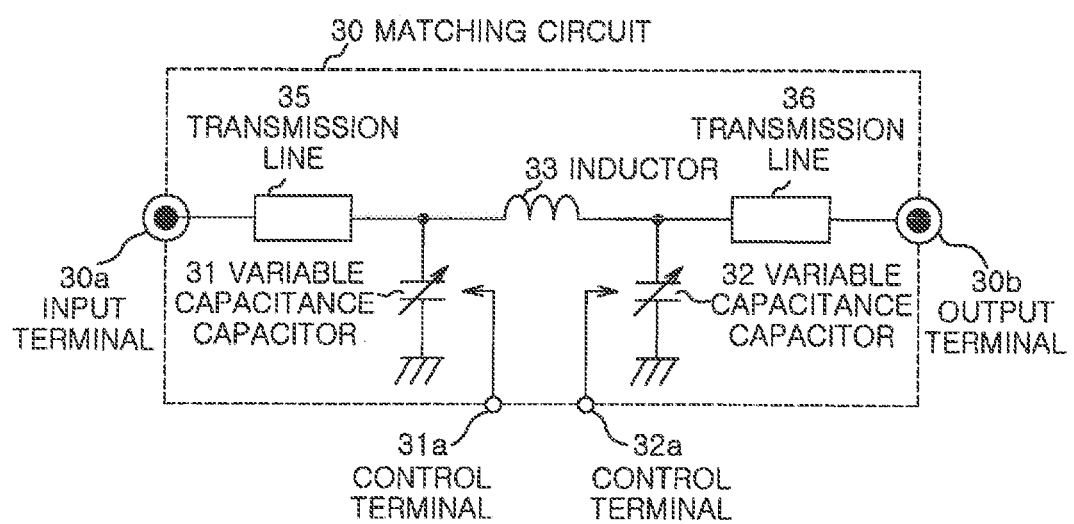
FIG. 2 shows a configuration a matching circuit according to an embodiment.

FIG. 2 shows a configuration of the matching circuit according to the embodiment. A circuit configuration of the matching circuit 30 is determined by a variation range of the input impedance of the plasma processing apparatus 3 which acts as a load. Here, a π-type matching circuit will be described as an example. The matching circuit 30 includes variable capacitance capacitors 31 and 32, an inductance 33, and transmission lines 35 and 36. The transmission lines 35 and 36 may be configured as coaxial cables, metal plates, or the like and may include a lumped constant circuit of an inductor or a capacitor.

An input terminal 30a of the matching circuit 30 and one end of the variable capacitance capacitor 31 are connected through the transmission line 35. The other end of the variable capacitance capacitor 31 is grounded. An output terminal 30b of the matching circuit 30 and one end of the variable capacitance capacitor 32 are connected through the transmission line 36. The other end of the variable capacitance capacitor 32 is grounded.

The variable capacitance capacitors 31 and 32 and the inductance 33 serve as matching elements for matching an impedance between the RF generator 2 and the plasma processing apparatus 3. The matching circuit 30 further includes a variable capacitance capacitor control terminal 31a for controlling a capacitance of the variable capacitance capacitor 31 and a variable capacitor control terminal 32a for controlling a capacitance of the variable capacitance capacitor 32.

The variable capacitance capacitor of the matching circuit 30 is controlled such that the reflection coefficient Γ calculated from the forward power Pf and the reflected power Pr detected by the directional coupler 11 becomes smaller.

As described above, the control unit 20 calculates a reflection coefficient based on the forward power and the reflected power detected by the directional coupler 11 and controls a capacitance value VC1 of the first variable capacitance capacitor 31 and a capacitance value VC2 of the second variable capacitance capacitor 32 by using the reflection coefficient. The storage unit 25 stores information on a circle or the like which will be described later.

The information on a circle is the information on a position or a size of a circle described by a trace of the reflection coefficient Γ which passes through a matching point (where the real part and the imaginary part of the reflection coefficient Γ are zero) on a Smith chart. It is known that the information on a circle is determined based on conditions of the transmission line 35, i.e., the characteristic impedance $Z_L$ and a line length L of the transmission line 35.

The capacitance calculation unit 22 calculates the capacitance values VC1 and VC2 of the variable capacitance capacitors 31 and 32 of the matching circuit 30 which correspond to the calculated reflection coefficient Γ based on the information on a circle which is stored in the storage unit 25 and the reflection coefficient Γ calculated by the reflection coefficient calculation unit 21. In other words, the capacitance calculation unit 22 calculates the capacitance values VC1 and VC2 that make the reflection coefficient Γ smaller.

Specifically, the capacitance calculation unit 22 calculates the capacitance value VC2 of the variable capacitance capacitor 32 of the matching circuit 30 such that the reflection coefficient F calculated by the reflection coefficient calculating unit 21 becomes close to the circle stored in the storage unit 25. The capacitance setting unit 23 changes the capacitance value VC2 of the variable capacitance capacitor 32 to the calculated capacitance value. Accordingly, the reflection coefficient Γ is positioned on the circle by the capacitance setting unit 23.

Then, the capacitance calculation unit 22 calculates the capacitance value VC1 of the variable capacitance capacitor 31 of the matching circuit 30 such that the reflection coefficient Γ calculated by the reflection coefficient calculation unit 21 becomes smaller. The capacitance setting unit 23 changes the capacitance value VC1 of the variable capacitance capacitor 31 to the calculated capacitance value. Accordingly, the reflection coefficient Γ is positioned on the matching point (where the reflection coefficient Γ is zero) by the capacitance setting unit 23.

Figure 3:
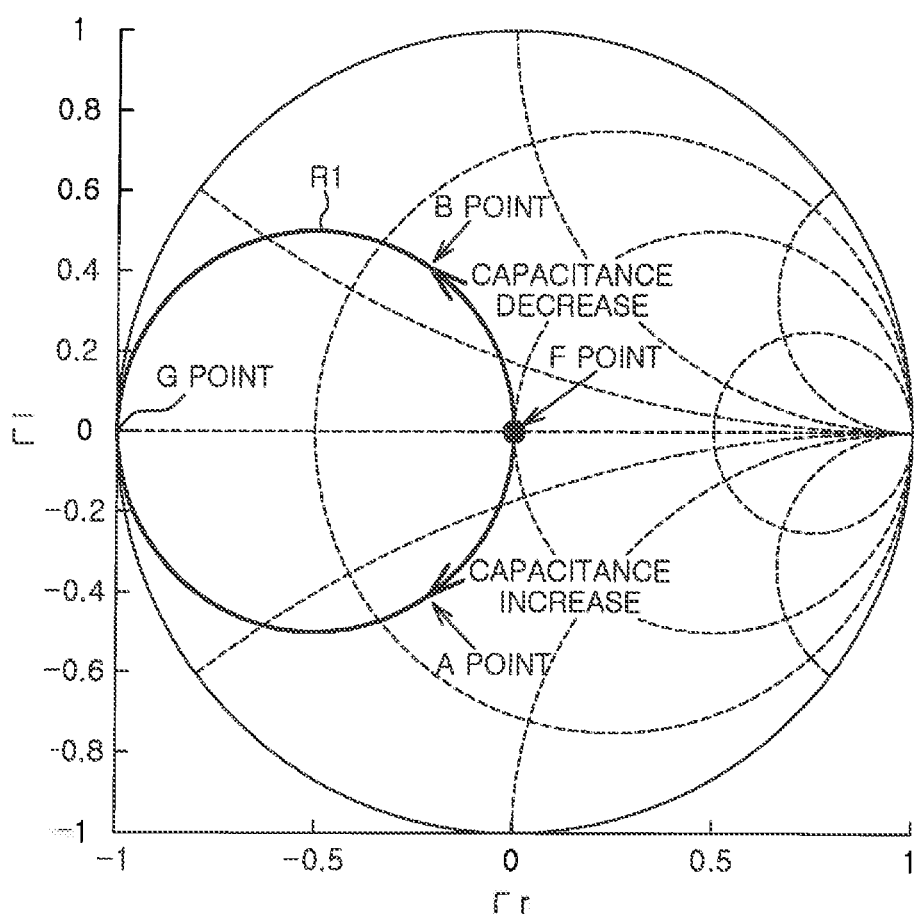
FIG. 3 explains an example of a reflection coefficient trace in the case of changing a capacitance of a variable capacitance capacitor.

The information on a circle determined by the transmission line 35 has been previously stored in the storage unit 25. As described above, the information on a circle (position and size) is determined based on the condition of the transmission line 35, i.e., the characteristics impedance $Z_L$ and the line length L of the transmission line 35. For example, when the transmission line 35 is short enough to be ignored, a circle R1 shown in FIG. 3 is drawn. When the transmission line 35 has a characteristic impedance of 50Ω and a line length of λ/4, a circle R2 shown in FIG. 4 or a circle R3 shown in FIG. 5 which will be described later is drawn.

Hereinafter, the principle of the matching algorithm of the present embodiment will be described. At a certain plasma load, when the impedance between the RF generator 2 and the plasma processing apparatus 3 is matched (i.e., when the reflection coefficient Γ is zero), the values of VC1 and VC2 are set to X and Y, respectively. For better understanding, a trace of the input impedance of the matching circuit 30, i.e., the trace of the reflection coefficient Γ, in the case of changing the value of VC1 from the matching condition in which VC1 is X and VC2 is Y, is shown on the Smith chart of FIG. 3. In this case, the transmission line 35 is short enough to be ignored compared to the wavelength λ of the forward power and the reflected power.

In FIG. 3, when the value of VC1 is changed, the trace of the reflection coefficient Γ describes the circle R1 having as a diameter a segment connecting G point and F point where the matching is realized. The reflection coefficient Γ at the F point has an imaginary part (Γi) of zero and a real part (Γr) of zero (the input impedance of the matching device 10 is 50Ω). The reflection coefficient F at the G point has an imaginary part of zero and a real part of −1.

Specifically, in FIG. 3, when the value of VC1 is increased in a state where the matching is realized (F point), the reflection coefficient Γ moves on the circle R1 from the F point to the A point. When the value of VC1 is decreased, the reflection coefficient Γ moves on the circle R1 from the F point to the B point. This is known as an impedance trace obtained when the variable capacitance capacitor 31 is connected to the ground (grounded) in the π-type matching circuit 30 shown in FIG. 2 which includes the variable capacitance capacitors 31 and 32 and the inductance 33. Therefore, detailed description thereof will be omitted.

Figure 4:
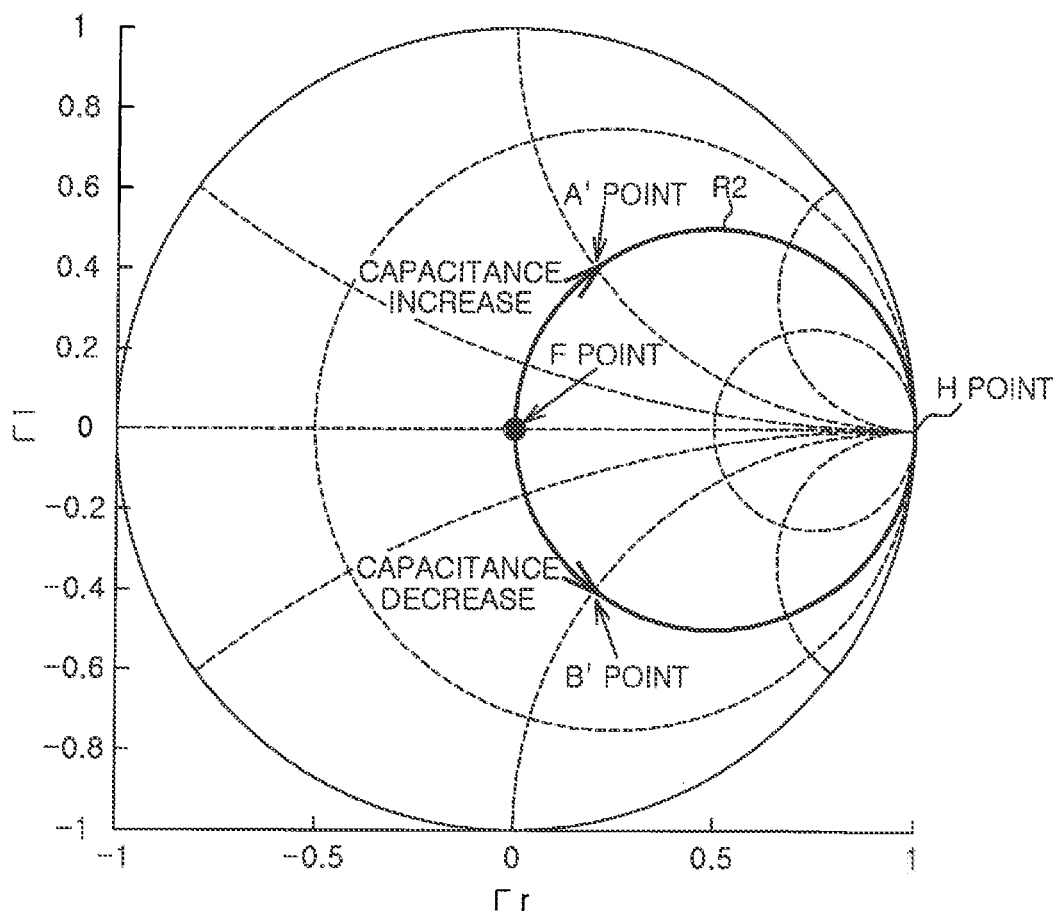
FIG. 4 explains another example of the reflection coefficient trace in the case of changing a capacitance of a variable capacitance capacitor.

FIG. 3 shows the case in which the transmission line 35 may be ignored. However, the transmission line 35 may not be ignored actually. FIG. 4 shows a trace of the reflection coefficient Γ on the Smith chart which is obtained when the transmission line 35 has a characteristic impedance of 50Ω and a line length of λ/4. In FIG. 4, the trace of the reflection coefficient Γ draws a circle R2 having as a diameter a segment connecting H point and the F point where the matching is realized. The reflection coefficient Γ at the H point has an imaginary part of zero and a real part of 1 (the input impedance of the matching device 10 is infinite).

In the matching circuit 30 of FIG. 2, it is assumed that an input impedance seen from the right end of the transmission line 35 is $Z_1$ and an input impedance seen from the left end of the transmission line 35 is $Z_2$. $Z_2$ is determined by the following Eq. (2). In the following Eq. (2), $Z_1$ indicates an input impedance in the case where the transmission line 35 may be ignored (FIG. 3) and $Z_2$ indicates an input impedance in the case where the transmission line 35 may not be ignored (FIG. 4). When the transmission line 35 may not be ignored (FIG. 4), the circle R1 shown in FIG. 3 is changed to the circle R2 shown in FIG. 4.

$$Z_2 = Z_L \frac{Z_1 + jZ_L \tan\left(\frac{2\pi}{\lambda}L\right)}{Z_L + jZ_1 \tan\left(\frac{2\pi}{\lambda}L\right)} \qquad \text{Eq. (2)}$$

In the case of inserting the transmission line 35 having a characteristic impedance of 50Ω and a line length of λ/4, the trace shown in FIG. 3 is changed to the trace shown in FIG. 4 by 1800 rotation about the point (F point) where the real part and the imaginary part of the reflection coefficient Γ are zero. Therefore, in FIG. 4, when the value of VC1 is increased in a state where the matching is realized (F point), the reflection coefficient Γ moves on the circle R2 toward A' point (direction in which the imaginary part of the reflection coefficient Γ is positive). When the value of VC1 is decreased, the reflection coefficient Γ moves on the circle R2 toward B' point (direction in which the imaginary part of the reflection coefficient Γ is negative). In other words, on the circle R2 shown in FIG. 4, when the imaginary part of the reflection coefficient Γ is positive, VC1 is greater than the matching value X, whereas when the imaginary part of the reflection coefficient Γ is negative, VC1 is smaller than the matching value X.

In FIG. 4, when the value of VC1 is increased or decreased at the matching point (F point), the reflection coefficient Γ follows the trace of the circle R2. This indicates that the reflection coefficient Γ moves on the circle R2 shown in FIG. 4 when VC1 is changed in a state where VC2 is set to the matching value. Therefore, it is preferable to control VC2 such that the reflection coefficient Γ is positioned on the circle R2 shown in FIG. 4 and then control VC1 such that the reflection coefficient Γ becomes zero.

Figure 5:
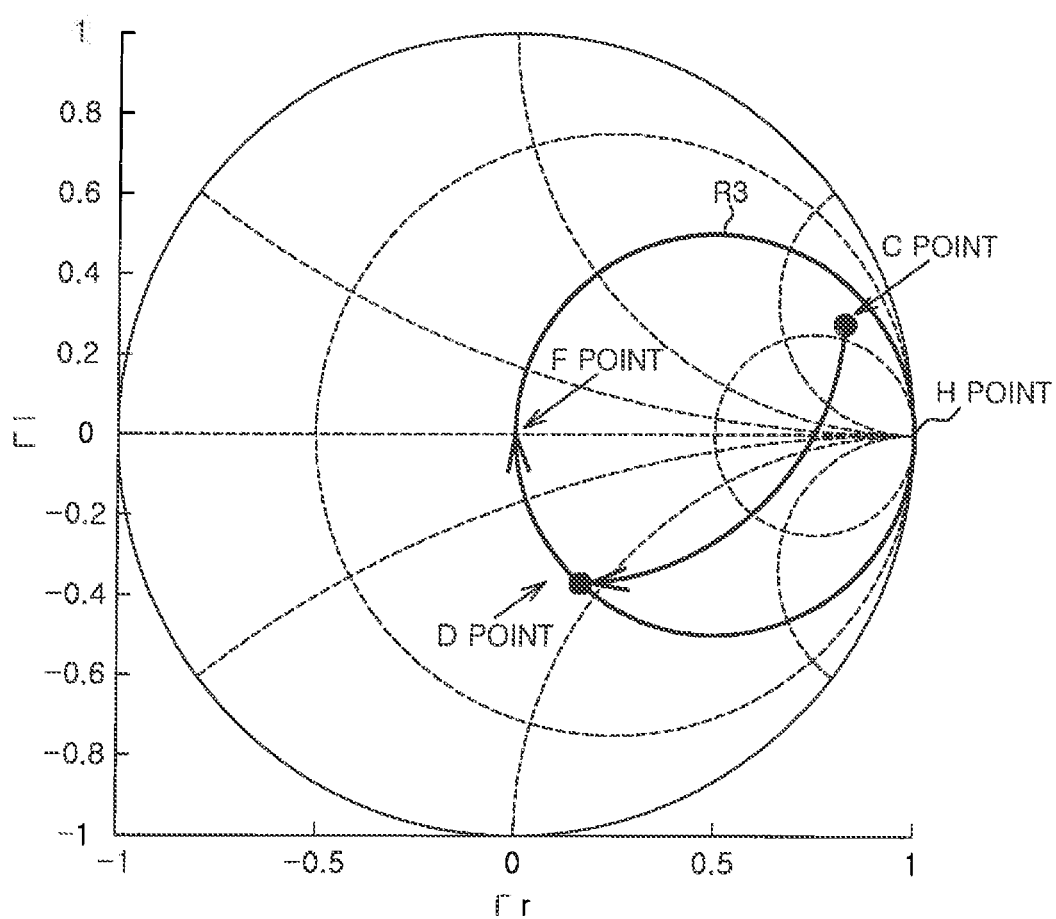
FIG. 5 shows a reflection coefficient trace according to an embodiment.

FIG. 5 shows a trace of the reflection coefficient Γ on the Smith chart in the case of performing the impedance matching according to the embodiment by the matching circuit 30 under the condition that the transmission line 35 has a characteristic impedance of 50Ω and a line length of λ/4 as in the case shown in FIG. 4. C point is the reflection coefficient Γ, i.e., the input impedance of the matching device 10, at the time when VC1 and VC2 are initial values (e.g., minimum values of the variable capacitance capacitor), in the case where the plasma load has a certain input impedance.

First, the control unit 20 increases only VC2 until the reflection coefficient Γ reaches from the C point where VC1 and VC2 are the initial values to D point on the circle R3. The circle R3 is the same as the circle R2 shown in FIG. 4. The information on the circle R3 is stored in the storage unit 25. When the reflection coefficient Γ reaches the D point on the circle R3, VC2 becomes a matching capacitance Y. In that state, VC2 is controlled to the matching value, whereas VC1 remains at the initial value. Therefore, the control unit 20 increases VC1. When VC1 is increased, the reflection coefficient Γ moves on the circle R3 as described above. Accordingly, it is preferable to stop the increase of VC1 when the reflection coefficient Γ becomes 0. At this time, VC1 becomes a matching capacitance X.

The trace shown in FIG. 5 is an example of the case in which an input impedance of the plasma load is a certain value. When the input impedance of the plasma load is changed, the positions of the C point and the D point are changed. However, when VC2 is the matching capacitance, the reflection coefficient Γ is positioned on the circle R3.

In the case of the C point shown in FIG. 5, a minimum value of the variable capacitance capacitor is selected as the initial value of VC1 and VC2. However, a maximum value of the variable capacitance capacitor or another value may be selected. In that case, the position of the C point is changed. However, regardless of the initial values of VC1 and VC2, when VC1 is changed in a state where VC2 is the matching capacitance, the reflection coefficient Γ moves on the circle R3.

Therefore, the control unit 20 controls only VC2 until the reflection coefficient Γ is positioned on the circle R3 and then controls only VC1 after the reflection coefficient Γ is positioned on the circle R3. In the control of VC2, the reflection coefficient Γ is outside the circle R3 if VC2 is greater than the matching value Y and, thus, VC2 is decreased so that the reflection coefficient Γ is positioned on the circle R3. On the contrary, the reflection coefficient Γ is inside the circle R3 if VC2 is smaller than the matching value Y and, thus, VC2 is increased so that the reflection coefficient Γ is positioned on the circle R3.

After VC2 is controlled so that the reflection coefficient Γ is positioned on the circle R3, VC1 is controlled in the following manner. Specifically, when the imaginary part of the reflection coefficient Γ is positive, VC1 is greater than the matching value X and, thus, VC is decreased so that the reflection coefficient Γ becomes zero. On the contrary, when the imaginary part of the reflection coefficient Γ is negative, VC1 is smaller than the matching value X and, thus, VC1 is increased so that the reflection coefficient Γ becomes zero.

Even when the input impedance of the plasma load is changed during the control of VC1 and VC2, VC2 and VC1 are controlled as described above. In other words, VC2 is controlled so that the reflection coefficient Γ is positioned on the circle R3 and, then, VC1 is controlled.

FIGS. 4 and 5 show as an example the case in which the transmission line 35 has a characteristic impedance of 50Ω and a line length of λ/4 in the matching circuit 30 of FIG. 2. However, the present invention is not limited thereto. If the condition of the transmission line 35 is different from the above condition, the trace of the circle in the case of changing VC1 under the condition in which VC2 is the matching capacitance is different from the trace of the circle R3 shown in FIGS. 4 and 5. Therefore, the trace of the circle which satisfies the condition of the transmission line 35 may be set by the above-described Eq. (2).

Figure 6:
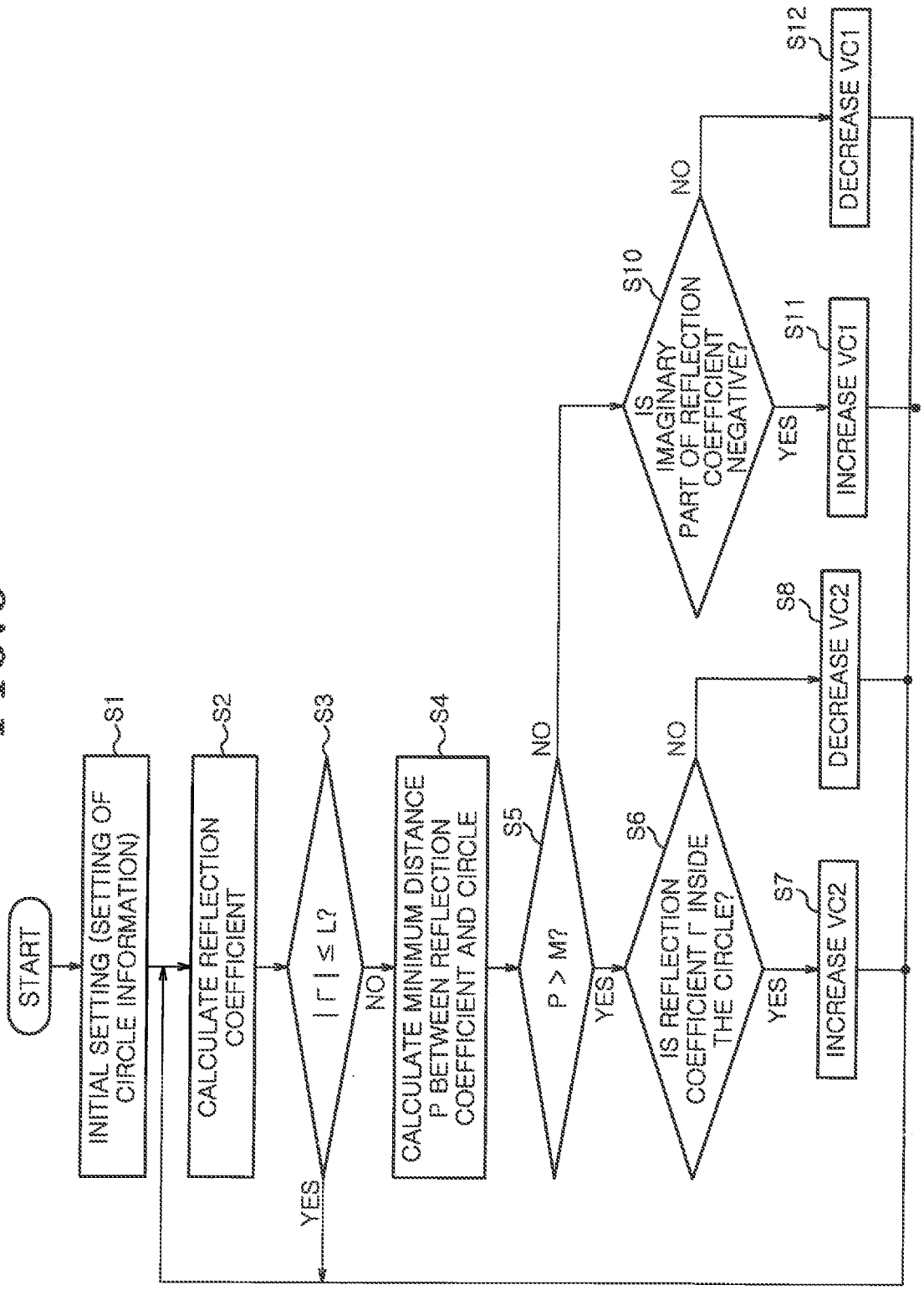
FIG. 6 is a flowchart of an impedance matching process according to an embodiment.

FIG. 6 is a flowchart of an impedance matching process according to the embodiment. This process is performed by the control unit 20. First, as an initial setting, the information on the circle shown in FIGS. 4 and 5 (size and position on the Smith chart) is stored in the storage unit 25 (step S1 of FIG. 6). Since the information on the circle is determined depending on the transmission line 35 as described above, the information corresponding to the matching circuit 30 is required. In the step S1, the initial values of VC1 and VC2 are also set.

Next, the reflection coefficient F at that time is calculated from the forward power Pf and the reflected power Pr obtained from the directional coupler 11 (step S2). Next, an absolute value of the reflection coefficient F and a predetermined value L are compared (step S3). When the absolute value of the reflection coefficient Γ is smaller than or equal to L (Yes in step S3), the process returns to the step S2 to obtain the forward power Pf and the reflected power Pr from the directional coupler 11 and calculate again the reflection coefficient Γ at that time.

When the absolute value of the reflection coefficient F is greater than L (No in step S3), the process proceeds to step S4. The predetermined value L is a threshold value for determining whether or not the matching is realized. The predetermined value L is ideally zero. However, a certain threshold value L is used because it is actually difficult to make the reflection coefficient F zero. The predetermined value L is determined by a reflection-resistant power of the RF generator 2 and specifications of the plasma processing apparatus 1 using the RF generator 2.

In the step S4, in order to determine whether or not the reflection coefficient Γ is positioned on the circle defined in the initial setting (step S1), the information on the circle is acquired from the storage unit 25 and a minimum value P of the distance between the reflection coefficient Γ and the circle is calculated. When the value P is greater than the predetermined threshold value M (Yes in step S5), VC2 is not the matching value and thus is controlled to be changed. Specifically, it is determined that the reflection coefficient Γ is not positioned on the circle, and the process proceeds to step S6. The predetermined threshold value M is ideally zero. Since, however, it is actually difficult to set the predetermined threshold value M to zero, the predetermined threshold value is set to a certain value.

When the minimum value P is smaller than or equal to the predetermined threshold M (No in step S5), VC2 is the matching value and there is no need to change VC2. Therefore, the process proceeds to an operation of controlling VC1 (i.e., the capacitance of the variable capacitance capacitor 31). In other words, it is determined that the reflection coefficient Γ is positioned on the circle and the process proceeds to step S10.

In the step S6, it is determined whether or not the reflection coefficient Γ is inside the circle to decide whether to increase or decrease VC2 (i.e., the capacitance of the variable capacitance capacitor 32). When the reflection coefficient Γ is inside the circle (Yes in step S6), VC2 is smaller than Y and thus is increased (step S7). When the reflection coefficient Γ is outside the circle (No in step S6), VC2 is greater than Y and thus is decreased (step S8). The amount of increase and decrease may be set in advance.

By repeating the processes from the step S2 to the step S7 or S8, the minimum value P can be smaller than or equal to the predetermined threshold value M. In other words, the reflection coefficient Γ can be positioned substantially on the circle. When it is determined in the step S5 that the minimum value P is smaller than or equal to the predetermined threshold value M, the process proceeds to the step S10 to perform the operation of controlling VC1 (i.e., the capacitance of the variable capacitance capacitor 31).

In the step S10, it is determined whether or not the imaginary part of the reflection coefficient Γ is negative. In other words, it is determined whether or not VC1 is smaller than X. As described above, when the imaginary part of the reflection coefficient Γ is negative, VC1 is smaller than X. When the imaginary part of the reflection coefficient Γ is positive, VC1 is greater than X. Therefore, when the imaginary part of the reflection coefficient Γ is negative (Yes in step S10), VC1 is increased. When the imaginary part of the reflection coefficient Γ is positive (No in step S10), VC1 is decreased. By changing VC1 in the above manner, the reflection coefficient Γ becomes close to zero. The amount of increase and decrease may be set in advance.

As described above, the control unit 20 calculates the reflection coefficient based on the forward power and the reflected power detected by the directional coupler 11. When the distance between the calculated reflection coefficient and the circle described by the trace of the reflection coefficient which passes through the matching point on the Smith chart is greater than a predetermined value, the control unit 20 changes the capacitance value of the second variable capacitance capacitor 32 and the calculated reflection coefficient to make the distance equal to or less than the predetermined value. When the distance becomes equal to or less than the predetermined value, the control unit 20 changes the capacitance value of the first variable capacitance capacitor 31 and makes the calculated reflection coefficient smaller without changing the distance. In other words, the control unit 20 calculates the reflection coefficient based on the forward power and the reflected power detected by the directional coupler 11 and changes the capacitance value of the first variable capacitance capacitor 31 and the capacitance value of the second variable capacitance capacitor such that the calculated reflection coefficient becomes smaller.

Figure 7:
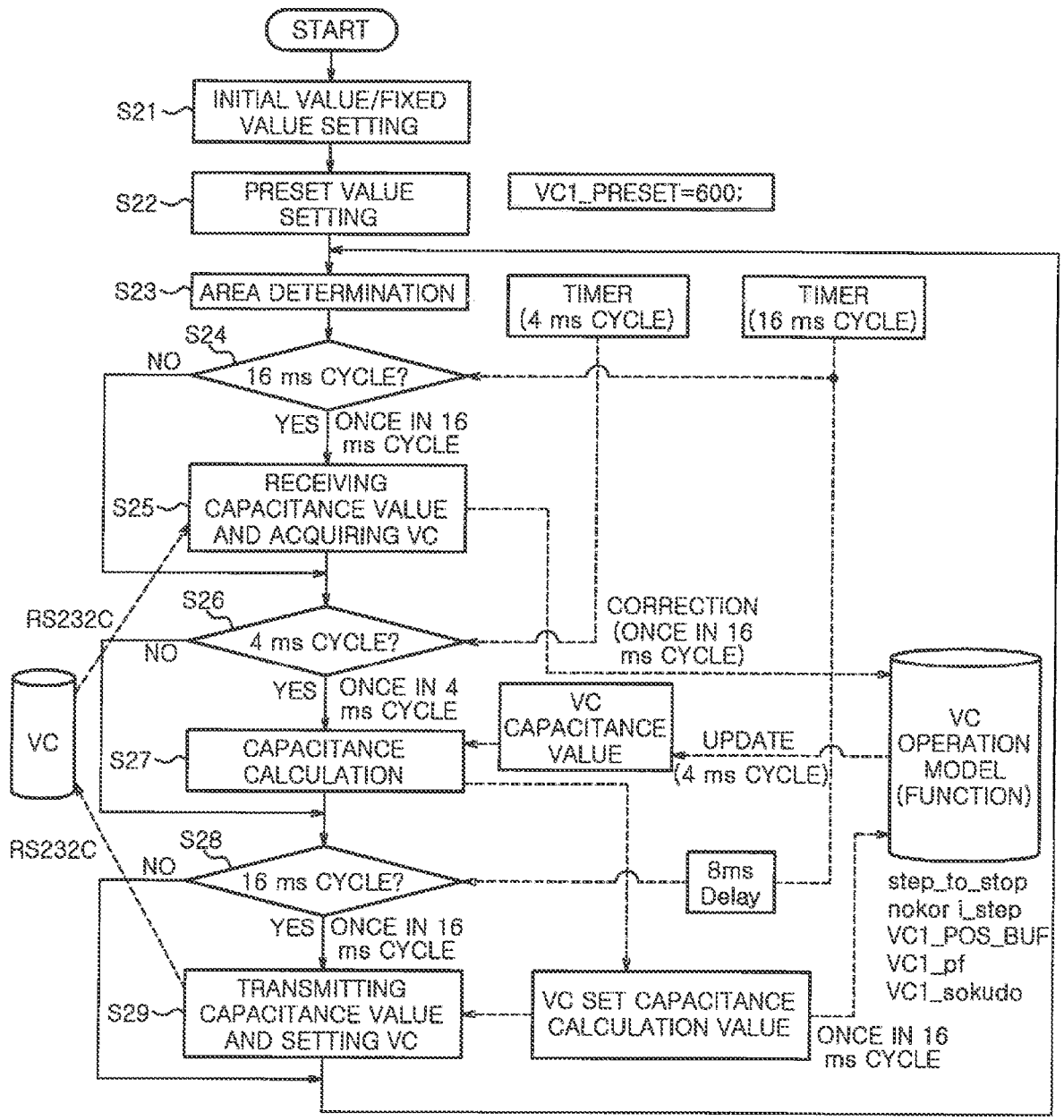
FIG. 7 shows an operation model of a stepping motor.

FIG. 7 is a flowchart of a capacitance calculation process for matching according to an embodiment.

Step S21: The control unit 20 sets an initial value/fixed value (processing of the step S1 in FIG. 6).

Step S22: The control unit 20 sets a PRESET value to VC1 (VC1_PRESET=600).

Step S23: The control unit 20 performs area determination.

Step S24: The control unit 20 determines whether or not it is a cycle (e.g., 16 ms cycle) for acquiring the capacitance values (VC1 and VC2) from the variable capacitance capacitors 31 and 32. It is determined based on a timer of 16 ms cycle. In the case of YES, the process proceeds to step S25. In the case of NO, the process proceeds to step S26. Hereinafter, VC1 and VC2 are collectively referred to as VC.

Step S25: The control unit 20 acquires the capacitance value VC from the variable capacitance capacitors 31 and 32 via RS232C communication. The control unit 20 transmits the acquired capacitance value to the VC operation model (function: calculation model) and uses the acquired capacitance value for correcting a calculation error.

Step S26: The control unit 20 determines whether or not it is a cycle (4 ms cycle, for example) for performing the capacitance calculation. It is determined based on a timer of 4 ms cycle. In the case of YES, the process proceeds to step S27. In the case of NO, the process proceeds to step S28.

Step S27: The control unit 20 (capacitance calculation unit 22) performs the capacitance calculation based on the VC capacitance value outputted from the VC operation model.

Step S28: The control unit 20 determines whether or not it is a cycle (e.g., 16 ms cycle) for setting the capacitance value VC of the variable capacitance capacitors 31 and 32. It is determined based on an output of a 16 ms cycle timer transmitted at a timing of 8 ms. In the case of YES, the process proceeds to step S29. In the case of NO, the process proceeds to step S23.

Step S29: The control unit 20 transmits the capacitance value (VC set capacitance calculation value) obtained in the step S27 to the variable capacitance capacitors 31 and 32 via the RS232C communication.

In other words, in the embodiment, the capacitance calculation is performed at a cycle of 4 ms. The acquisition and the setting of the capacitance values of the variable capacitance capacitors 31 and 32 via the RS232C communication are performed at a cycle of 16 ms. The acquired capacitance value is transmitted to the VC operation model (function: calculation model) and used for correcting a calculation error without being used for the capacitance calculation. The VC operation model outputs the VC capacitance value (obtained from the variable capacitance capacitor to be error-corrected once every 16 ms) at a 4 ms cycle so that the capacitance calculation can be performed at the 4 ms cycle.

Figure 8:
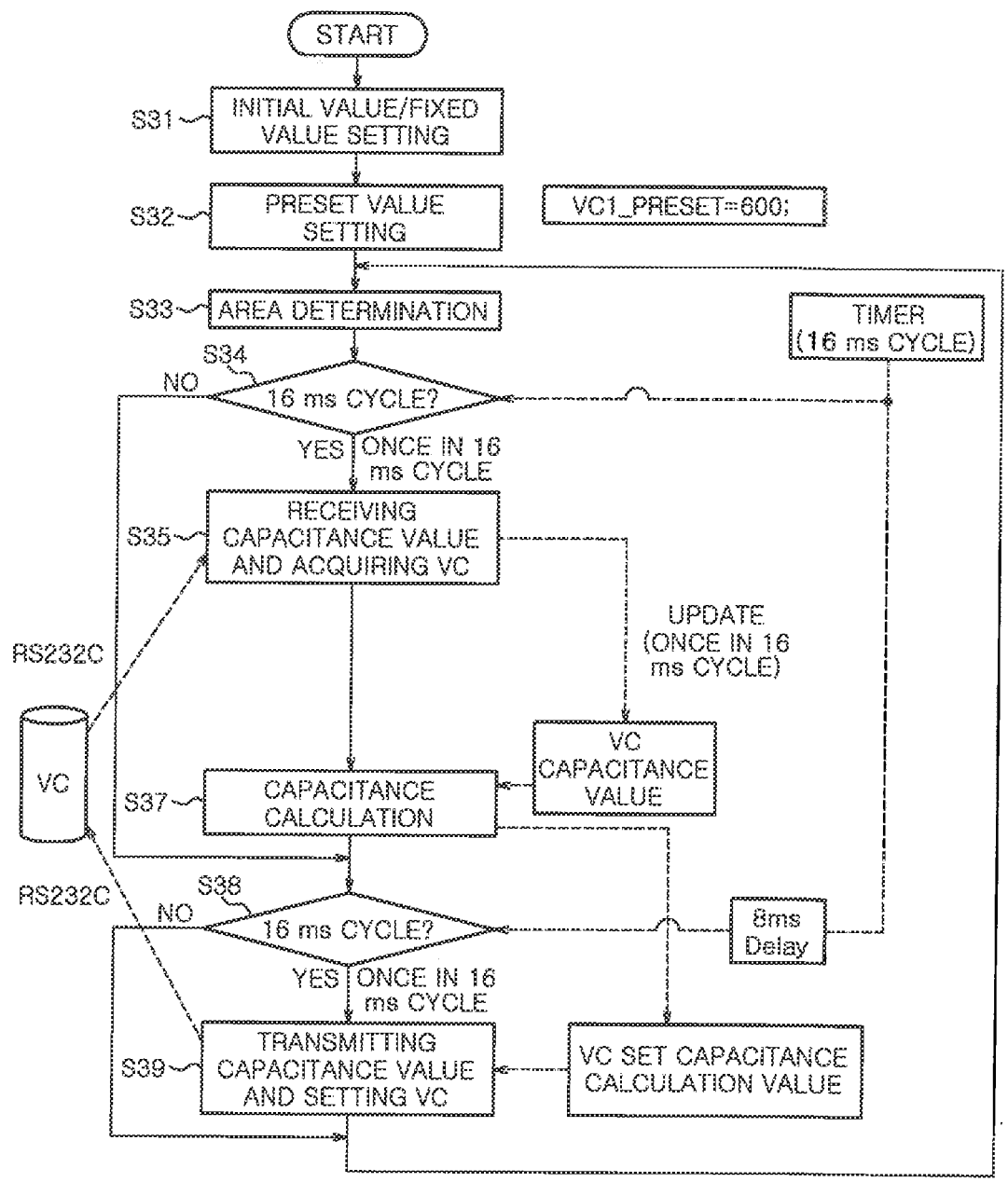
FIG. 8 is a flowchart of a matching operation according to a comparative example.

Next, a technique (hereinafter, referred to as "comparative example") that has been examined prior to the present invention by the present inventors will be described with reference to FIG. 8. FIG. 8 is a flowchart of a capacitance calculation process for matching according to the comparative example.

Step S31: The control unit 20 set an initial value/fixed value (processing of the step S1 in FIG. 6).

Step S32: The control unit 20 sets a PRESET value to VC1 (VC1_PRESET=600).

Step S33: The control unit 20 performs area determination.

Step S34: The control unit 20 determines whether or not it is a cycle (e.g., 16 ms cycle) for acquiring the capacitance values VC1 and VC2 from the variable capacitance capacitors 31 and 32. It is determined made based on a timer of 16 ms cycle. In the case of YES, the process proceeds to step S35. In the case of NO, the process proceeds to step S38.

Step S35: The control unit 20 acquires the capacitance value VC from the variable capacitance capacitors 31 and 32 via RS232C communication.

Step S37: The control unit 20 (capacitance calculation unit 22) performs the capacitance calculation based on the capacitance value VC acquired in the step S35.

Step S38: The control unit 20 determines whether or not it is a cycle (e.g., 16 ms cycle) for setting the capacitance value VC of the variable capacitance capacitors 31 and 32. It is determined based on an output of a 16 ms cycle timer transmitted at a timing of 8 ms. In the case of YES, the process proceeds to step S39. In the case of NO, the process proceeds to step S33.

Step S39: The control unit 20 transmits the capacitance value (VC set capacitance calculation value) obtained in the step S37 to the variable capacitance capacitors 31 and 32 via the RS232C communication.

In other words, in the comparative example, the capacitance value VC is acquired from the variable capacitance capacitors 31 and 32 via the RS232C communication at a 16 ms cycle. After the capacitance calculation, a new set capacitance value is transmitted to the variable capacitance capacitors 31 and 32 via the RS232C communication. In this case, the capacitance calculation is performed once every 16 ms, and the value VC used for the calculation is updated once every 16 ms.

The variable capacitance capacitors 31 and 32 use a stepping motor to change the capacitance value, and a serial I/F (interface) such as RS232C/RS485 or the like is used as the I/F for the variable capacitance capacitor control terminals 31a and 32a. The response time of the serial I/F requires about 10 ms (from transmission/reception of a command to start of transmission/reception of a next command) while depending on a baud rate. When the variation speed of the plasma load impedance is fast, the period of 10 ms affects a tracking function as an original function of the matching unit, and a calculation error is likely to occur due to a temporal error.

Accordingly, as in the comparative example, if the capacitance calculation is performed by acquiring the capacitance value at the cycle of 16 ms without acquiring the capacitance value at a cycle shorter than the response time of the serial I/F, when the variation speed of the plasma load impedance is fast as described above, the tracking function as the original function of the matching unit is affected, and a calculation error is likely to occur due to a temporal error.

By shortening the cycle of the capacitance calculation as in the embodiment, the following effects are obtained. (1) The accuracy of the calculation is improved. The accuracy of prediction calculation is improved. As a result, a calculation accuracy of a target capacitance value of the variable capacitance capacitors 31 and 32 is improved. Therefore, a period time required to reach the target capacitance value is shortened. In addition, a risk of plasma loss due to deterioration of the impedance is reduced. (2) A setting interval of the variable capacitance capacitors 31 and 32 can be shortened, and high-speed control can be performed. The control cycle of the stepping motor is shortened by employing a sequence of acquiring the capacitance value of the variable capacitance capacitor at a cycle of, e.g., 32 ms, instead of acquiring the capacitance value at a cycle of 16 ms as in the comparative example, and shortening a setting cycle of (or increasing the number of setting) the target value (capacitance calculation value) of the variable capacitance capacitor. Accordingly, the matching operation time can be shortened (the matching operation can be performed within a more appropriate period of time).

The above-described specific time (cycle) is merely an example and may vary.

In the embodiment, the accuracy of the capacitance calculation of the matching circuit 30 is improved by shortening the response time by interpolating the capacitance values of the variable capacitance capacitors 31 and 32 by calculation. Hereinafter, a method thereof will be described.

The principle of the operation of the stepping motor is characterized in that the stepping motor is driven by a pulse input (the number of pulses) and a rotation angle is proportional to the number of input pulses. A pulse frequency to be inputted to the stepping motor has a constraint that the stepping motor cannot follow if the pulse frequency exceeds "maximum self-starting frequency" at the time of startup and "maximum continuous response frequency" during continuous rotation. Therefore, the stepping motor generally operates at a speed pattern shown in FIG. 9.

FIG. 9 shows a speed pattern in which the speed is accelerated and decelerated at uniform acceleration and becomes constant after reaching a maximum level. There are approximations using trigonometric functions and exponential functions closer to the actual operation. Although the speed pattern of uniform acceleration has a large difference from the actual motor operation, it is advantageous in that the processing (the calculation amount) is small. Therefore, the explanation will be made on the assumption that the speed pattern of uniform acceleration is employed.

Here, detailed description of the operation principle will be omitted, and a method of estimating a capacitance value in a transient state of the variable capacitance vacuum capacitor by using the speed pattern model will be described.

Figure 10A:
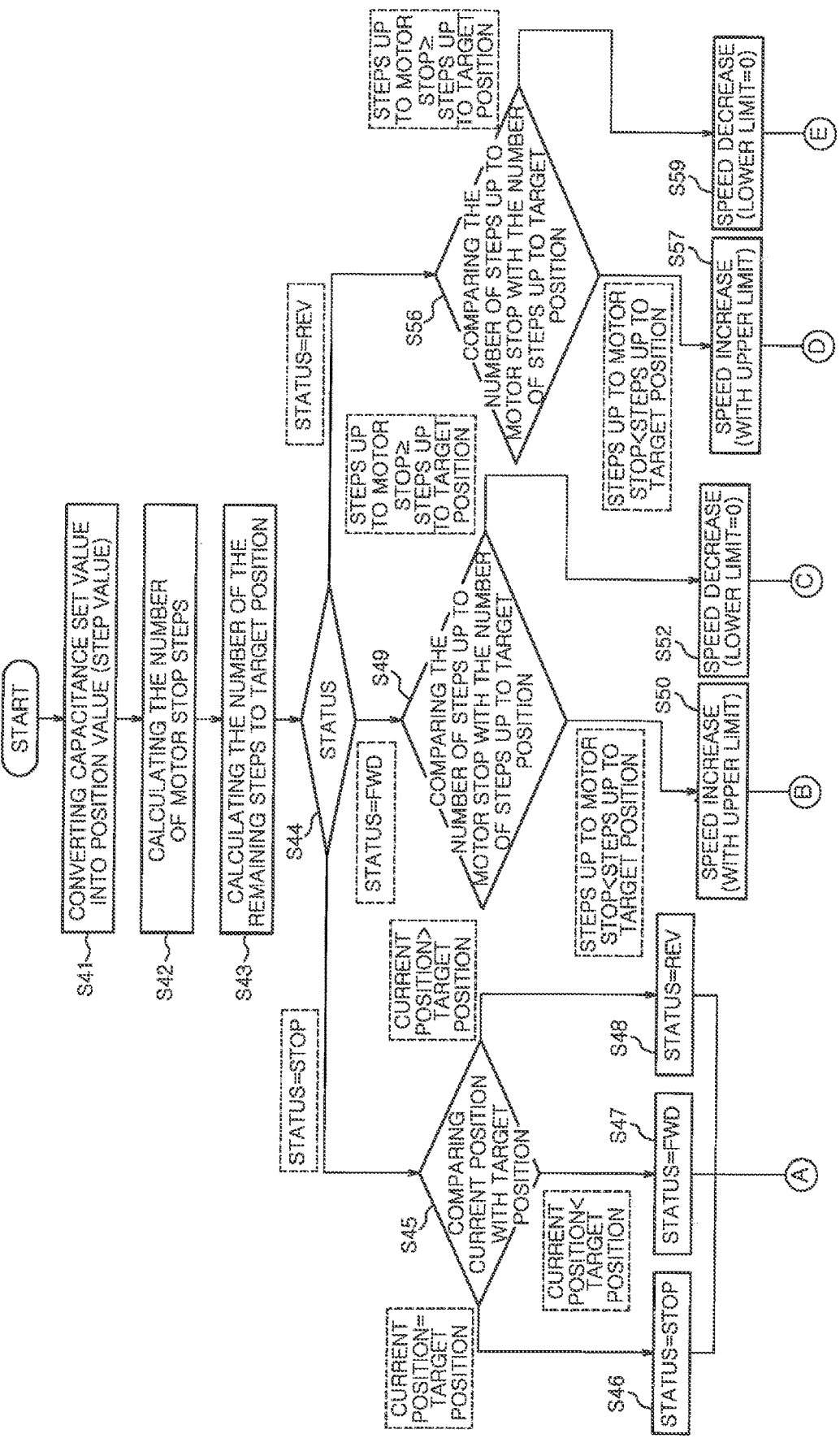
FIGS. 10A and 10B are a flowchart of a VC operation model process according to the embodiment.
Figure 10B:
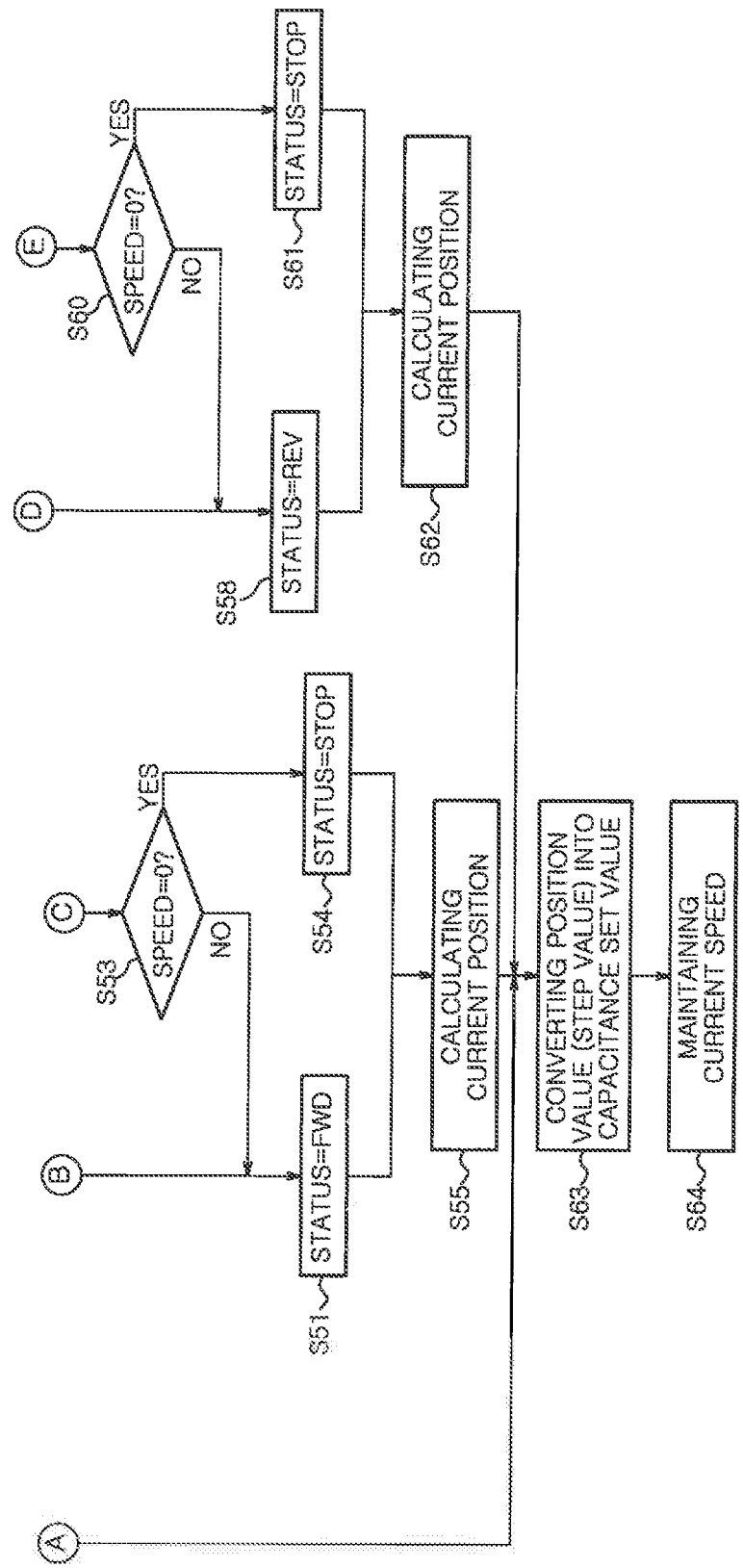

Next, the VC operation model (function) in FIG. 7 will be described in detail with reference to FIGS. 10A and 10B. FIGS. 10A and 10B show an operation flow of the VC operation model on the assumption that the VC operation model operates at a cycle of 4 ms. An input data is a target capacitance set value which is an output from the capacitance calculation unit 22. When the motor is set to stop as an initial value, STATUS is STOP and the motor speed (variable is V) is 0.

Step S41: The control unit 20 starts processing at a cycle of 4 ms and converts the capacitance set value into a position value (step value) of the variable capacitance capacitor.

Step S42: The control unit 20 calculates the number of steps required to stop the motor with respect to a current motor speed. Since V is zero when the motor is stopped, the number of steps required to stop the motor is 0.

Step S43: The control unit 20 calculates the number of steps from a current position to a target position.

Step S44: The control unit 20 performs the processing depending on STATUS. When STATUS is STOP, the process proceeds to step S45. When STATUS is FWD (step increasing direction), the process proceeds to step S49. When STATUS is REV (step decreasing direction), the process proceeds to step S56.

Step S45: The control unit 20 compares the current position with the target position. If the current position is the same as the target position, the process proceeds to step S46. If the current position is smaller than the target position, the process proceeds to step S47. If the current position is greater than the target position, the process moves to step S48.

Step S46: Since the motor remains stopped, the control unit 20 maintains STATUS at STOP.

Step S47: The control unit 20 changes STATUS from STOP to FWD.

Step S48: The control unit 20 changes STATUS from STOP to REV.

Step S49: The control unit 20 compares the number of steps. The number of steps required until the motor is stopped (the number of steps rotated from now even when the speed of the motor is decreased) which is calculated from the current motor speed V(t) is compared with the number of steps from the current position (step) to the number of steps to the target. If the number of steps required until the motor is stopped is smaller than the number of steps to the target position, the process proceeds to step S50. If the number of steps required until the motor is stopped is greater than the number of steps to the target, the process proceeds to step S52.

Step S50: The control unit 20 accelerates the stepping motor. At this time, the stepping motor is accelerated (speed increase) based on the following Eq. (3) by using the acceleration model shown in FIG. 9.

$$V(t)=V(t-1)+\Delta V \qquad \text{Eq. (3)}$$

The speed has an upper limit.

Step S51: The control unit 20 maintains STATUS at FWD.

Step S52: The control unit 20 starts to decelerate the stepping motor to stop at the target point. At that time, the stepping motor is decelerated (speed decrease) based on the following Eq. (4) by using the acceleration model shown in FIG. 9.

$$V(t)=V(t-1)-\Delta V \qquad \text{Eq. (4)}$$

Here, a lower limit value is 0.

Step S53: The control unit 20 determines whether or not the speed is zero. In the case of YES in the step S53, the process proceeds to step S54. In case of NO, the process proceeds to step S51.

Step S54: The control unit 20 changes STATUS from FWD to STOP.

Step S55: The control unit 20 calculates the current position.

Step S56: If STATUS is REV, the control unit 20 compares the number of steps as in the step S49 and executes the same processing except that the rotation direction of the motor is opposite. If the number of steps required until the motor is stopped is smaller than the target number of steps, the process proceeds to step S57. If the number of steps required until the motor stops is greater than the target number of steps, the process proceeds to step S59.

Step S57: The control unit 20 accelerates the stepping motor. At that time, the stepping motor is accelerated (speed increase) based on the Eq. (3). The speed has an upper limit value.

Step S58: The control unit 20 maintains STATUS at REV.

Step S59: The control unit 20 starts to decelerate the stepping motor to stop at the target point. At this time, the stepping motor is decelerated (speed decrease) based on the Eq. (4). The lower limit value is 0.

Step S60: The control unit 20 determines whether or not the speed is zero. In the case of YES in the step S60, the process proceeds to step S61. In the case of NO, the process proceeds to step S51.

Step S61: The control unit 20 changes STATUS from REV to STOP.

Step S62: The control unit 20 calculates the current position.

Step S63: The control unit 20 converts the position value (step value) to the capacitance set value.

Step S64: The control unit 20 maintains the current speed.

By managing the current speed as described above, the operation approximate to the speed model of the motor is realized.

The calculation will be described by using specific numerical values as an example.

When the maximum speed of the stepping motor in FIG. 9 is 360 rot/min, i.e., 6 rot/sec, for example, a motor of 400 steps per rot moves 0.6 step every 4 ms.

During acceleration, in the speed pattern of the stepping motor shown in FIG. 9, on the assumption that 100 ms is required from the stop state to reach the maximum speed (6 rot/sec) and 100 ms is required from the maximum speed (6 rot/sec) to reach the stop state, 100 ms is 25 times of 4 ms and an increasing speed per 4 ms is 6 [rot/sec]/25=0.24 [rot/sec].

The acceleration a[rot/sec] is calculated as follows:

$a=6$ [rot/sec]/0.1 [sec]=60 [rot/sec$^2$].

At the time of forward acceleration, the current speed (v(t)) is calculated as follows: v(t)–v(t–1)+0.24[rot/sec], and the number of steps required to stop the motor from the current speed v(t)[rot/sec]) is calculated by using the Eq. (5).

$$v^2 - v0^2 = 2*a*X \qquad \text{Eq. (5)}$$

the number of steps required to stop the motor =
$(v(t)^2 - 0)/(2*a) =$
$v(t)^2/(2*60 \text{ [rot/sec}^2\text{]}) = (1/120)*v(t)^2 \text{ [rot]} =$
$400 \text{ [step/rot]}*(1/120)*v(t)^2 \text{ [step]} = (20/6)*v(t)^2$ The capacitance value of the variable capacitance capacitor can be interpolated by performing the calculation flow of the VC operation model shown in FIGS. 10A and 10B which includes the above calculations. By using the capacitance value obtained by the interpolation and the reflection coefficient that can be acquired in real time, the capacitance calculation can be performed at a cycle of 4 ms (shorter than that in the comparative example) as shown in FIG. 7.

The above calculation of the VC model has a large number of errors. The accuracy is improved by adding an error correction function to this model calculation. The error correction function will be described below.

The function of correcting the error with respect to the actual capacitance value will be described.

The uniform acceleration model shown in FIG. 9 is a simple model and is different in movement from the actual variable capacitance capacitor. Therefore, it is required to correct the difference based on the capacitance value that is actually acquired at a regular interval.

Figure 11A:
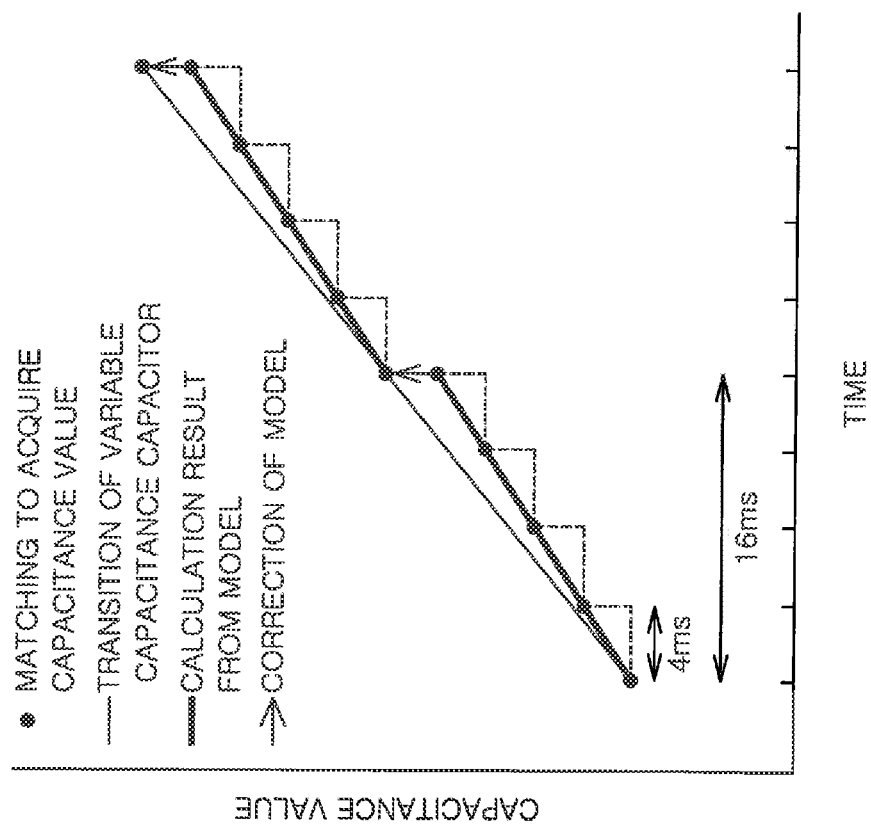
FIG. 11A explains position correction of the VC operation model according to the comparative example.
Figure 11B:
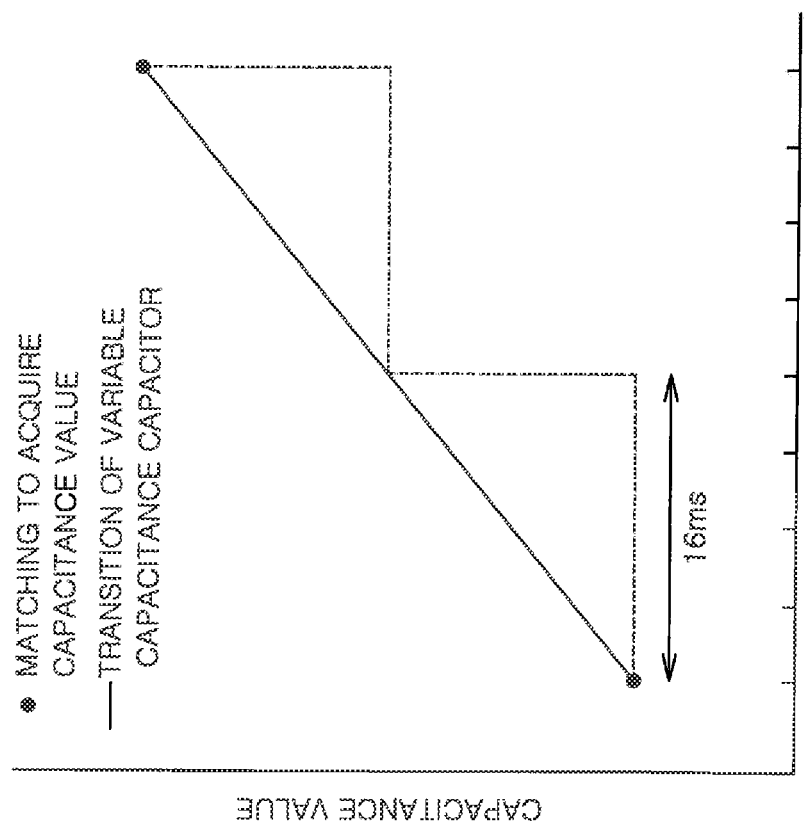
FIG. 11B explains position correction of the VC operation model according to the embodiment.

FIGS. 11A and 11B explain the correction of the capacitance value (step) of the model.

FIG. 11A shows a comparative example in which the capacitance value is acquired at a cycle of 16 ms and the matching is performed at a cycle of 16 ms. On the other hand, FIG. 11B shows the embodiment in which the process of acquiring the capacitance value at a cycle of 16 ms and the process of calculating the capacitance value by using the model at a cycle of 4 ms are performed and the correction is performed at a cycle of 16 ms. These processes are repeated to correct the capacitance value of the model and reduce the deviation from the actual data.

Figure 12:
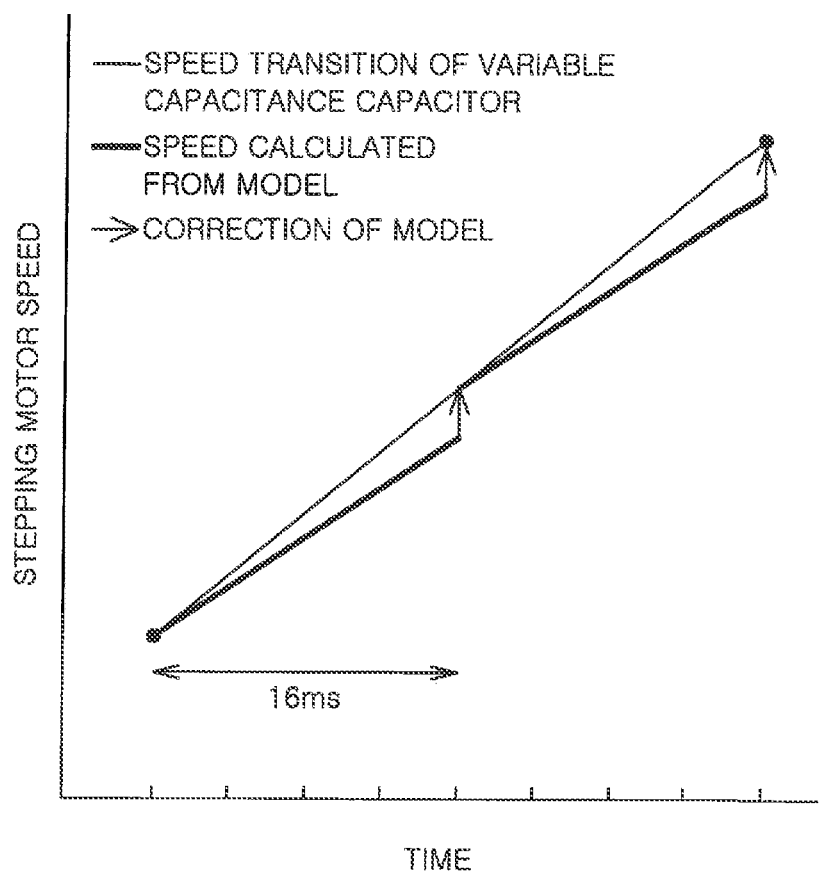
FIG. 12 explains speed correction of a motor of the VC operation model according to the embodiment.

FIG. 12 explains the speed correction of the model. The speed correction is performed every 16 ms based on the actual data.

In this method, for example, an average speed "Vave_vc" in a 16 ms section is calculated from the capacitance value of the variable capacitance capacitor which is acquired every 16 ms. Further, in the model, a section average speed "Vave_model" (corresponding to 16 ms) 4 times of the 4 ms cycle is calculated. A difference (ΔVave=Vave_vc−Vave_model) between Vave_vc and Vave_model is obtained, and a correction amount ΔVave×2 is added to (or subtracted from) the latest speed.

At this time, both of a speed and a position are corrected. In the case of correcting only the position, an error continuously occurs in the speed managed by the model. Therefore, it is required to correct the speed as well as the position.

With this correction function, it is possible to interpolate the capacitance value in the transient state of the variable capacitance capacitor with high accuracy, improve the accuracy of the matching operation, and contribute to the matching operation and the stability of the matching time.

The matching device according to the embodiment is suitable for a microwave power supply for plasma generation or the like, and can operate at various frequencies including ISM bands such as 13.56 MHz, 915 MHz, 2.45 GHz, 5.8 GHz and the like.

This specification includes at least the following configurations related to the present invention.

(First Configuration)

A matching device including:

A directional coupler configured to detect a forward power and a reflected power;

a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to one end of the first variable capacitance capacitor and the other end connected to one end of the second variable capacitance capacitor; and a control unit configured to control a capacitance value of the first variable capacitance capacitor and a capacitance value of the second variable capacitance capacitor based on the forward power detected by the directional coupler and the reflected power, wherein the control unit calculates a reflection coefficient based on the forward power and the reflected power detected by the directional coupler, the control unit changes the capacitance value of the first variable capacitance capacitor and the capacitance value of the second variable capacitance capacitor such that the calculated reflection coefficient becomes smaller, and the control unit makes a period of calculation of set values of the capacitance value of the first variable capacitance capacitor and the capacitance value of the second variable capacitance capacitor shorter than a period of acquisition of the capacitance value of the first variable capacitance capacitor and the capacitance value of the second variable capacitance capacitor.

(Second Configuration)

In the matching device of the first configuration, the first variable capacitance capacitor and the second variable capacitance capacitor control the capacitance values by using a stepping motor, and a serial interface is used as an interface for a control terminal of the stepping motor.

(Third Configuration)

In the matching device of the second configuration, the capacitance values in a transition state of the first variable capacitance capacitor and the second variable capacitance capacitor are estimated and interpolated by using a speed pattern model of the stepping motor in which a speed is accelerated and decelerated at uniform acceleration and becomes constant after reaching a maximum level.

(Fourth Configuration)

In the matching device of the second configuration, the cycle of calculation of the set value of the capacitance value of the first variable capacitance capacitor and the capacitance value of the second variable capacitance capacitor is made to be shorter than response time of the serial interface, and the cycle of acquisition of the capacitance value of the first variable capacitance capacitor and the capacitance value of the second variable capacitance capacitor is made to be longer than the response time of the serial interface.

While the embodiment of the present invention conceived by the present inventor has been described in detail, the present invention is not limited thereto, and various modifications can be made.

INDUSTRIAL APPLICABILITY

The present invention can be applied to a matching device, and can also be applied to an RF generator using a matching device. Further, the present invention can be applied to a plasma processing apparatus in a semiconductor manufacturing process for performing etching and thin film formation. This application claims priority to Japanese Patent Application No. 2016-055355 filed on Mar. 18, 2016, the entire contents of which are incorporated herein by reference.

DESCRIPTION OF REFERENCE NUMERALS

2: RF generator
3: plasma processing apparatus
10: matching device
11: directional coupler
20: control unit
21: reflection coefficient calculation unit
22: capacitance calculation unit
23: capacitance setting unit
30: storage unit
30: matching circuit
30a: input terminal
30b: output terminal
31, 32: variable capacitance capacitor
31a, 32a: control terminal
33: inductance
35, 36: transmission line

What is claimed is:

1. A matching device comprising:
a directional coupler configured to detect a forward power and a reflected power;
a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to the one end of the first variable capacitance capacitor and the other end connected to the one end of the second variable capacitance capacitor; and
a control unit configured to control a capacitance value of the first variable capacitance capacitor and a capacitance value of the second variable capacitance capacitor based on the forward power and the reflected power detected by the directional coupler,
wherein the control unit calculates a reflection coefficient based on the forward power and the reflected power detected by the directional coupler, changes the capacitance value of the first variable capacitance capacitor and the capacitance value of the second variable capacitance capacitor such that the calculated reflection coefficient becomes smaller, and makes a cycle of calculation of set values of the capacitance value of the first variable capacitance capacitor and the capacitance value of the second variable capacitance capacitor shorter than a cycle of acquisition of the capacitance value of the first variable capacitance capacitor and the capacitance value of the second variable capacitance capacitor,
wherein the capacitance value of the first variable capacitance capacitor and the capacitance value of the second variable capacitance capacitor are controlled by using a stepping motor, and a serial interface is used as an interface for a control terminal of the stepping motor, and
wherein the control unit is configured to estimate and interpolate the capacitance values of the first variable capacitance capacitor in a transition state and the capacitance values of the second variable capacitance capacitor in a transition state by using a speed pattern model of the stepping motor in which a speed is accelerated and decelerated at uniform acceleration and becomes constant after reaching a maximum level.

2. The matching device of claim 1, wherein the matching device is configured to match an output of a high frequency power supply.

* * * * *